United States Patent
Iyanagi

(10) Patent No.: US 9,111,859 B2
(45) Date of Patent: Aug. 18, 2015

(54) NON-VOLATILE MEMORY DEVICE

(71) Applicant: Kabushiki Kaisha Toshiba, Minato-ku (JP)

(72) Inventor: Katsumi Iyanagi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 77 days.

(21) Appl. No.: 14/022,395

(22) Filed: Sep. 10, 2013

(65) Prior Publication Data

US 2014/0339492 A1  Nov. 20, 2014

Related U.S. Application Data

(60) Provisional application No. 61/823,498, filed on May 15, 2013.

(51) Int. Cl.
*H01L 47/00* (2006.01)
*H01L 27/24* (2006.01)

(52) U.S. Cl.
CPC .................................. *H01L 27/249* (2013.01)

(58) Field of Classification Search
CPC ................ H01L 2924/00; H01L 2224/48091; H01L 45/146; H01L 2924/1461; H01L 2924/3025; H01L 45/04; H01L 45/1233; H01L 27/10876; H01L 2924/00014; H01L 45/085; H01L 45/1266; H01L 45/1633; H01L 21/04

USPC ........ 438/99, 659, 667, 962; 257/2–4, 9, 364, 257/E29.134, E21.597, E29.086, E29.174
See application file for complete search history.

(56) References Cited

U.S. PATENT DOCUMENTS

| | | | |
|---|---|---|---|
| 8,891,277 B2 | 11/2014 | Murooka | |
| 2013/0148400 A1 | 6/2013 | Murooka | |
| 2014/0369104 A1 | 12/2014 | Murooka | |

FOREIGN PATENT DOCUMENTS

JP    2013-120618 A    6/2013

*Primary Examiner* — Mark A Laurenzi
(74) *Attorney, Agent, or Firm* — Oblon, McClelland, Maier & Neustadt, L.L.P.

(57) ABSTRACT

According to an embodiment, a non-volatile memory device includes a first interconnection extending in a first direction, a plurality of second interconnections provided side by side on the first interconnection and extending in a second direction intersecting the first direction and a memory layer provided on a side surface of each second interconnection. The device also includes a control element provided between each of the second interconnections and the first interconnection, an element part extending in the second direction, and a control electrode facing a side surface of the element part via a first insulating film. An adjustment part is provided on the first interconnection and adjacent to a control element connected to a second interconnection disposed at an end position of the second interconnections arranged in the first direction, and a first outer electrode provided between the adjustment part and the control element disposed at the end position.

13 Claims, 20 Drawing Sheets

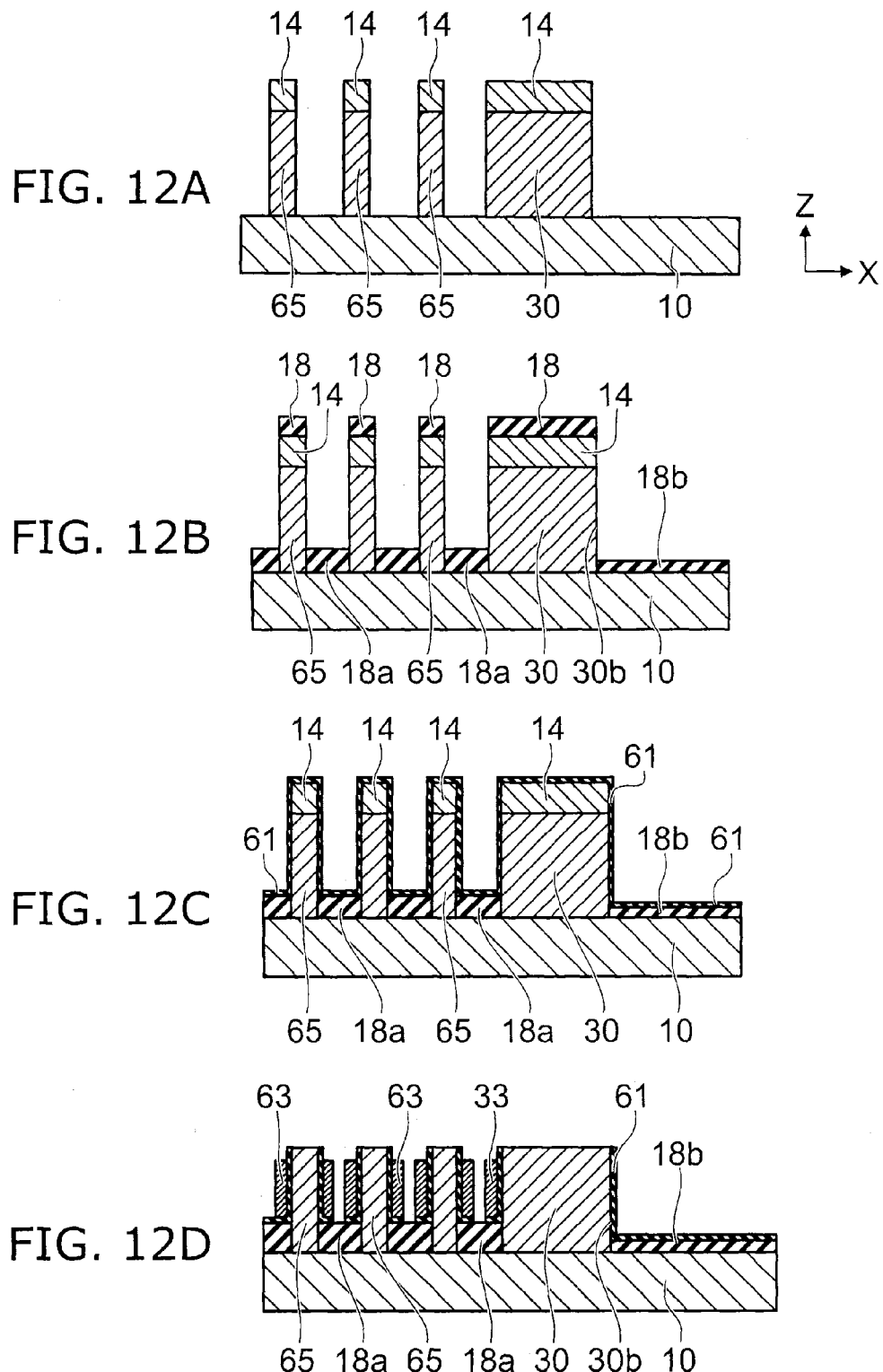

NON-VOLATILE MEMORY DEVICE

CROSS-REFERENCE TO RELATED APPLICATIONS

This Application is based upon and claims the benefit of priority from U.S. Provisional Patent Application 61/823,498, filed on May 15, 2013; the entire contents of which are incorporated herein by reference.

FIELD

Embodiments are related generally to a non-volatile memory device.

BACKGROUND

A non-volatile memory device having a three-dimensional structure and using a memory cell formed of a variable resistance film or the like has been under developing. Many of these memory devices are manufactured through a process of manufacturing a semiconductor device, so called a semiconductor process. The micro-fabrication technology of the semiconductor process may improve the degree of integration and increase a storage capacity. However, the semiconductor process is sometimes implemented with structural non-uniformity and then decreases a manufacturing yield.

BRIEF DESCRIPTION OF THE DRAWINGS

FIGS. 12A to 12D are schematic cross-sectional views illustrating an example of a manufacturing process of the non-volatile memory device according to a variation of the first embodiment;

DETAILED DESCRIPTION

Figure 1:
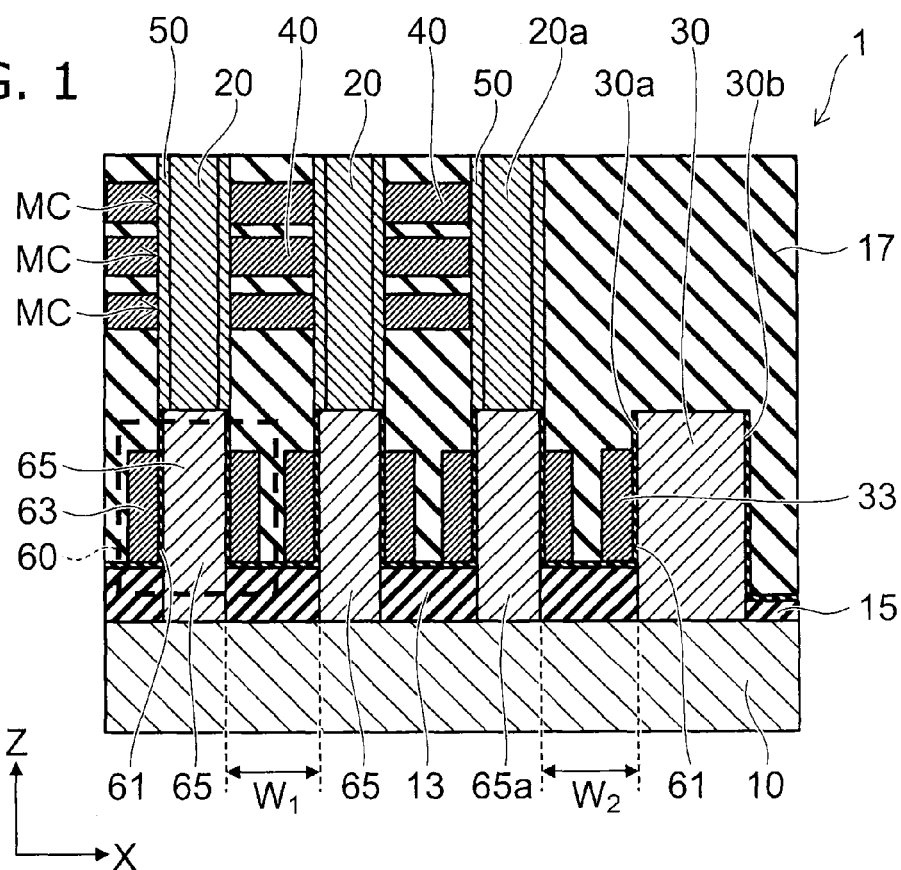
FIG. 1 is an example of a schematic cross-sectional view illustrating a non-volatile memory device according to a first embodiment.

According to an embodiment, a non-volatile memory device includes a first interconnection extending in a first direction, a plurality of second interconnections provided side by side on the first interconnection and extending in a second direction intersecting the first direction, and a memory layer provided on a side surface of each second interconnection. The device also includes a control element provided between each of the second interconnections and the first interconnection, a element part provided on the first interconnection and extending in the second direction, and a control electrode facing a side surface of the element part via a first insulating film. An adjustment part is provided on the first interconnection and adjacent to a control element connected to a second interconnection disposed at an end position of the second interconnections arranged in the first direction, and a first outer electrode provided between the adjustment part and the control element disposed at the end position.

Embodiments will be described below with reference to the drawings. Detailed description of a part identical among the drawings will be omitted as appropriate by assigning the identical reference numeral to the part, whereby a part different among the drawings will be described. Note that the drawings are provided schematically or conceptually, meaning the relationship between the thickness and the width of each part or the ratio of sizes of parts thereamong is not necessarily identical to that in reality. Moreover, the same part is sometimes shown with a dimension or ratio that is different depending on the drawings.

First Embodiment

FIG. 1 is an example of a schematic cross-sectional view showing a non-volatile memory device according to a first embodiment.

Figure 2:
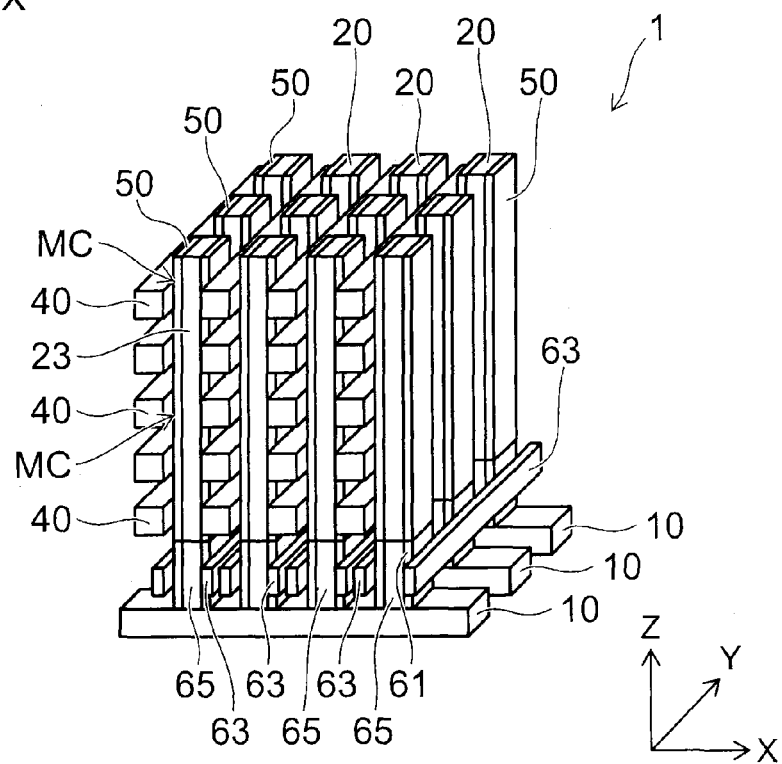
FIG. 2 is an example of a schematic perspective view illustrating the non-volatile memory device according to the first embodiment.

FIG. 2 is an example of a perspective view schematically showing the non-volatile memory device according to the first embodiment. Note that an insulating film provided between each component is omitted from FIG. 2 in order to have a better view of the configuration of the non-volatile memory device.

The non-volatile memory device according to the embodiment has a memory cell (MC) of a variable resistance type, for example, and includes a three-dimensional memory cell array 1 provided on a silicon substrate. The arrangement and shape of each component will be described below with reference to an X direction (a first direction), a Z direction (a second direction), and a Y direction (a third direction) shown in each drawing. The Y direction is orthogonal to the X direction while the Z direction intersects an X-Y plane including the X direction and the Y direction. For example, the Z direction is perpendicular to the X-Y plane. In some cases, the Z direction is expressed as upward whereas a –Z direction is expressed as downward.

A memory cell array 1 includes a plurality of global bit lines 10 (first wiring) extending in the X direction and provided side by side in the Y direction, and a plurality of local bit lines 20 (second wiring) extending in the Z direction and provided side by side on each of the global bit lines 10. Also included are word lines 40 provided between two of the local bit lines 20 adjacent to each other and a memory layer 50 provided between the local bit line 20 and the word line 40. An insulating film 17, for example, is provided between each of the interconnections which are thereby mutually insulated.

The word line 40 extends in the Y direction. The memory layer 50 is a variable resistance film, for example, where the resistance thereof reversibly changes from a first resistance value to a second resistance value by current flowing between the local bit line 20 and the word line 40 or voltage applied between the local bit line 20 and the word line 40.

As shown in FIG. 1, a control element 60 is provided between each of the local bit lines 20 and the global bit line 10. The control element 60 has a element part 65 provided between the global bit line 10 and the local bit line 20 and extending in the Z direction, and a control electrode 63 facing a side surface of the element part 65 through an insulating film 61 (a first insulating film). The control element 60 performs on/off control of electrical conduction between global bit line 10 and the local bit line 20 connected thereto. The element part 65 includes a semiconductor such as polycrystalline silicon. The control element 60 is a field effect transistor (FET), for example, and thus the element part 65 includes source/drain regions and a channel formed between the source/drain regions, for example.

The memory cell array 1 further includes an adjustment part 30 provided on at least one side (preferably both sides) of a plurality of the element parts 65 provided side by side on the global bit line 10 (refer to FIG. 1). The adjustment part 30 is provided such that a distance W2 (or an interval) between the adjustment part 30 and a element part 65a, which is adjacent the element part 65a and disposed at an end of the plurality of element parts 65, is equal to a distance W1 between two of the element parts 65 adjacent to each other. The adjustment part 30 includes a material same as that of the element part 65, for example.

Here, "the equal interval" is not limited to a strict match of the interval but tolerates a difference caused by processing accuracy in a manufacturing process, for example.

While one adjustment part is provided at one end of the element parts 65 in FIG. 1, the other adjustment part 30 may also be provided at another end not shown (same for the other drawings to be shown below). Moreover, the adjustment part 30 is provided in order to make the distance W2 equal to the distance W1. The adjustment part 30 may be a part provided exclusively for above purpose or take a configuration having another function furthermore. Note that the adjustment part 30 in the X direction may be made wider than the element part 65.

The memory cell array 1 further includes an outer electrode 33 (a first outer electrode) provided between the adjustment part 30 and the element part 65a. For example, the outer electrode 33 is provided contiguously to a side surface 30a of the adjustment part 30, the side surface 30a facing a local bit line 20a. Another element such as an insulating film 61 may be interposed between the adjustment part 30 and the outer electrode 33. A side surface 30b of the adjustment part 30 is provided at a side opposite to the side surface facing the local bit line 20a.

The memory cell array 1 includes an insulating film 13 (a second insulating film) provided between the global bit line 10 and the control electrode 63 and an insulating film 15 (a third insulating film) provided on a side of the adjustment part 30 opposite to the side on which the outer electrode 33 is provided. The insulating film 15 is provided on an upper surface of the global bit line 10 extending in the X direction from the side surface 30b of the adjustment part 30. The insulating film 15 is provided thinner than the insulating film 13 in the Z direction.

Figure 3:
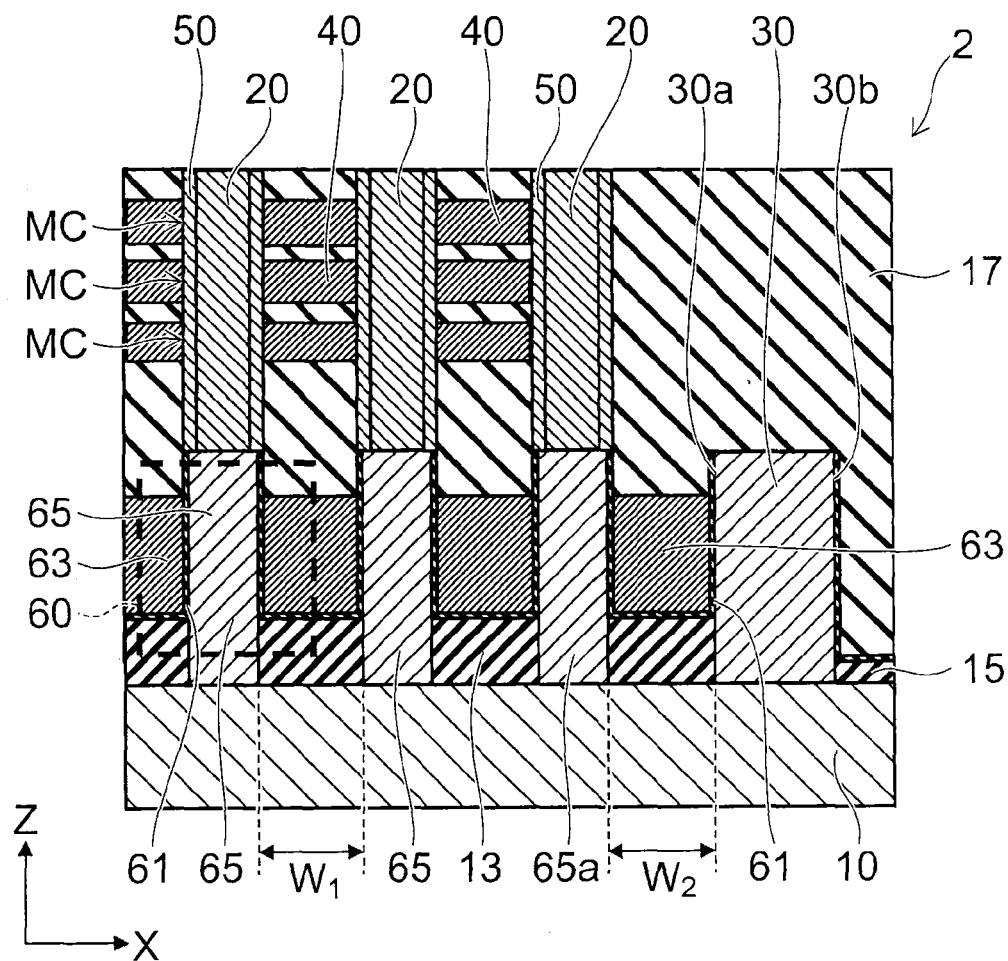
FIG. 3 is an example of a schematic cross-sectional view illustrating a non-volatile memory device 2 according to a variation of the first embodiment.

FIG. 3 is an example of a schematic cross-sectional view showing a non-volatile memory device 2 according to a variation of the first embodiment. In this example, a control electrode 63 is shared between control elements 60 that are adjacent to each other in the X direction. The control electrode 63 is singly provided in place of the control electrode 63 and an outer electrode 33 between an element part 65a and an adjustment part 30. The control electrode 63 is formed to fill the space between adjacent element parts 65. The control electrode 63 faces the element part 65 through an insulating film 61. Accordingly, the control element 60 can control the on/off of electrical conduction between the global bit line 10 and the local bit line 20 by applying voltage to the control electrode 63 provided on both sides of the element part 65. In this example, the control electrode is provided singly between the adjacent element parts 65. The interval between the adjacent element parts 65 may therefore be narrowed, making the non-volatile memory device 2 suited for shrinking thereof and increasing memory capacity.

Now, a method of manufacturing the non-volatile memory device according to the first embodiment will be described with reference to FIG. 4A to FIG. 11B. FIG. 4A to FIG. 11B are schematic views showing an example of manufacturing process of the non-volatile memory device according to the first embodiment.

Figure 4A:
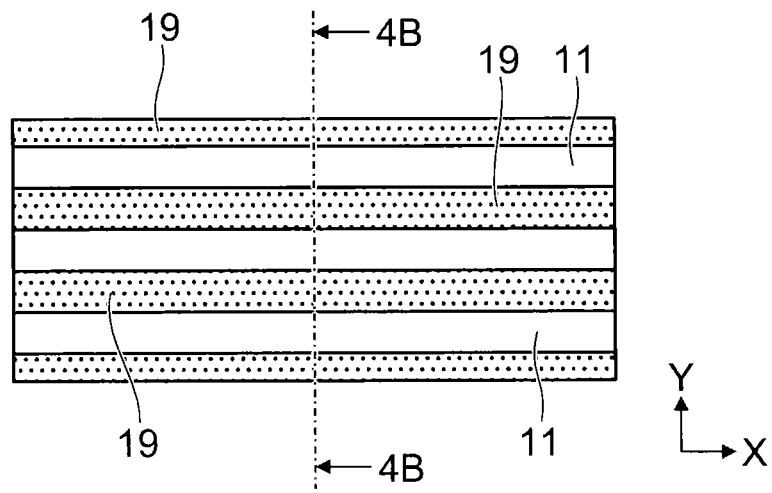
FIGS. 4A to 11B are schematic views illustrating an example of a manufacturing process of the non-volatile memory device according to the first embodiment.
Figure 4B:
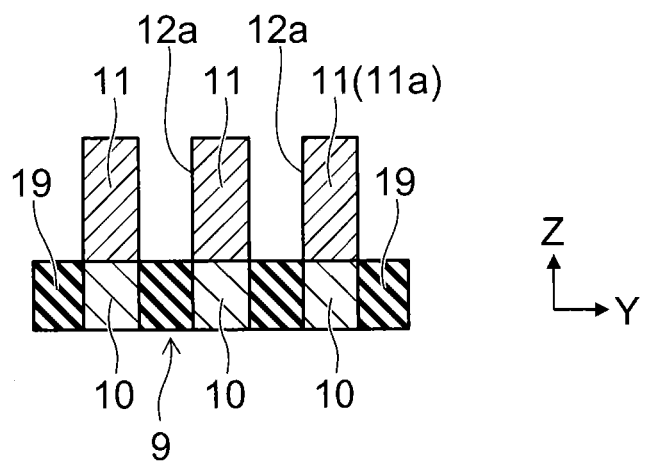

FIG. 4A is a plan view showing upper surfaces of a plurality of conductive layers 11, which are provided side by side in the Y direction. FIG. 4B is a cross section taken along line 4B-4B shown in FIG. 4A.

As shown in FIG. 4A and FIG. 4B, the conductive layer 11 is formed on the global bit line 10, where the global bit line 10 and the conductive layer 11 are formed in stripes extending in the X direction.

As shown in FIG. 4B, the global bit line 10 is provided on an underlying layer 9. The plurality of global bit lines 10 is provided side by side in the Y direction while interposing an insulating film 19 therebetween. For example, a conductive layer 11a is formed on the global bit line 10 and the insulating film 19. A mask (not shown), which has the same pattern as that of the global bit line 10, is then formed on the conductive layer 11a. This mask is used to etch the conductive layer 11a using an RIE (Reactive Ion Etching) method, for example, and form a groove 12a extending in the X direction. As a result, the conductive layer 11a extends in the X direction and is divided into the plurality of conductive layers 11 provided side by side in the Y direction.

The underlying layer 9 is an interlayer insulating film that is provided on a silicon substrate (a silicon wafer), for example. The conductive layer 11a is a polycrystalline silicon layer, for example. In the description of the manufacturing process below, the underlying layer and a structure formed thereon are sometimes expressed as a wafer.

Figure 5A:
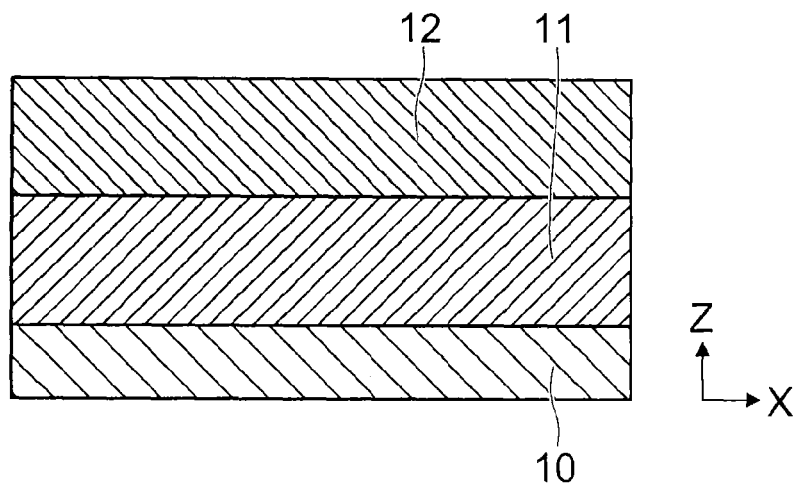
Figure 5B:
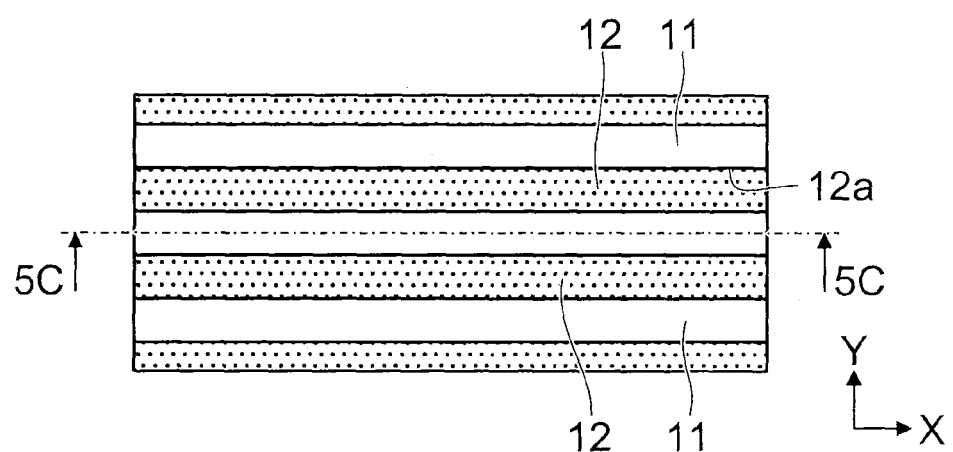
Figure 5C:
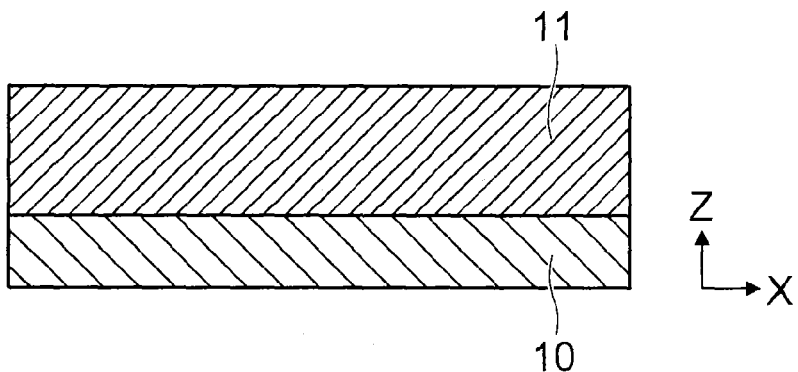

FIG. 5A to FIG. 5C are schematic views showing the manufacturing process following FIGS. 4A and 4B. FIG. 5A is a cross section of the conductive layer 11 and the global bit line parallel in the X direction and is for example, a cross-sectional view taken along line 5C-5C shown in FIG. 5B. FIG. 5B is a plan view showing an upper surface of the wafer, while FIG. 5C is a cross-sectional view taken along line 5C-5C shown in FIG. 5B.

As shown in FIG. 5A, an insulating film 12 is formed on the conductive layer 11 to fill a groove 12a extending in the X direction. Subsequently, as shown in FIG. 5B and FIG. 5C, the insulating film 12 is etched back such that an upper surface thereof is approximately at the same height as the conductive layer 11. The insulating film 12 is a silicon oxide film or a silicon nitride film formed on the wafer using a CVD (Chemical Vapor Deposition) method, for example.

Figure 6A:
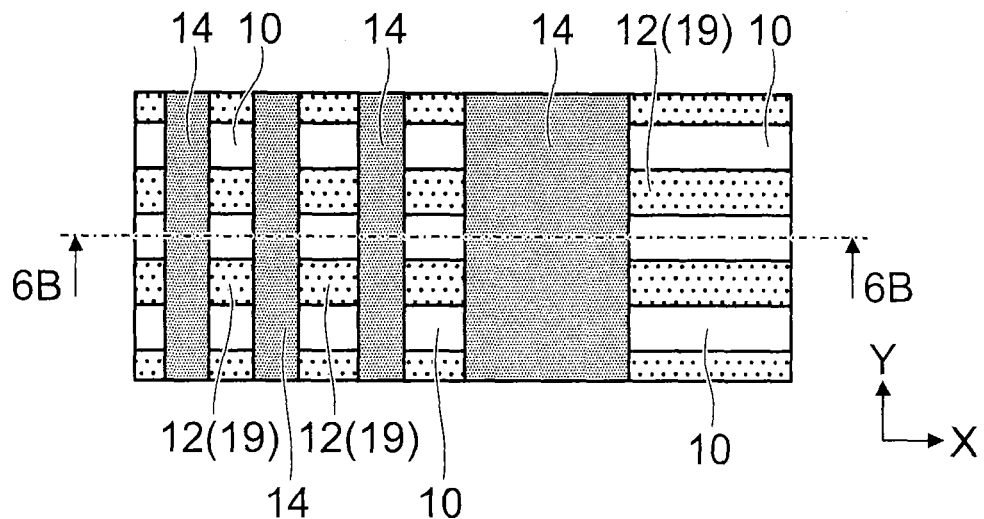
Figure 6B:
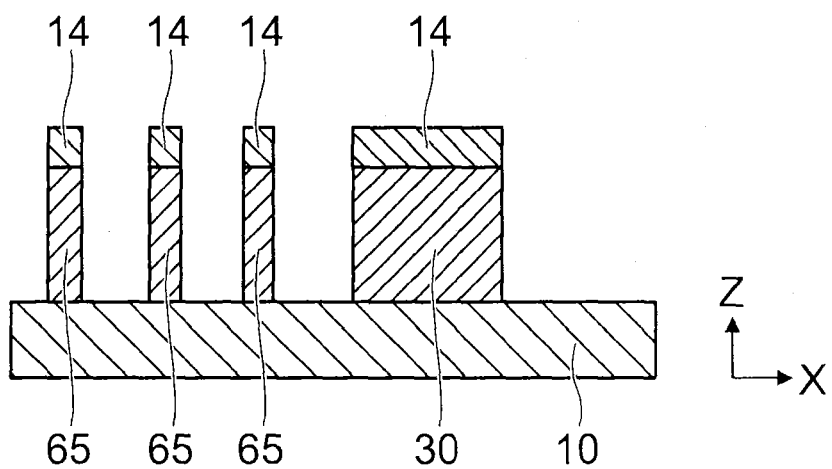

FIG. 6A and FIG. 6B show the manufacturing process following FIGS. 5A and 5B. FIG. 6A is a plan view showing an upper surface of the wafer while FIG. 6B is a cross-sectional view taken along line 6B-6B shown in FIG. 6A. The relationship between A and B in each drawing will hereinafter be the same in FIG. 7A to FIG. 11B.

A mask 14 having a pattern extending in the Y direction is formed on the conductive layer 11 and the insulating film 19. Thereafter, the conductive layer 11 is selectively etched by means of the REI method, for example. Thereby, the element part 65 and the adjustment part 30 are formed on the global bit line 10. That is, the element part 65 and the adjustment part 30 are formed simultaneously by dividing the conductive layer 11 and include the same material such as polycrystalline silicon.

Figure 7A:
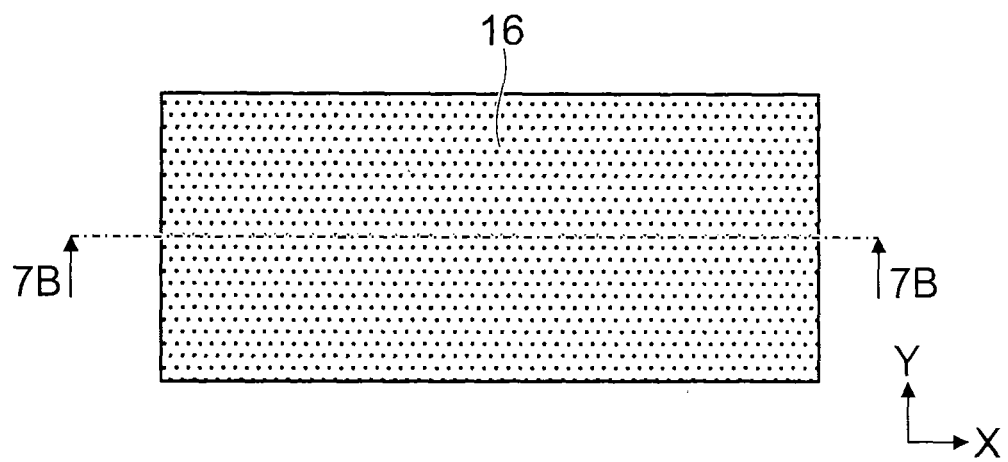
Figure 7B:
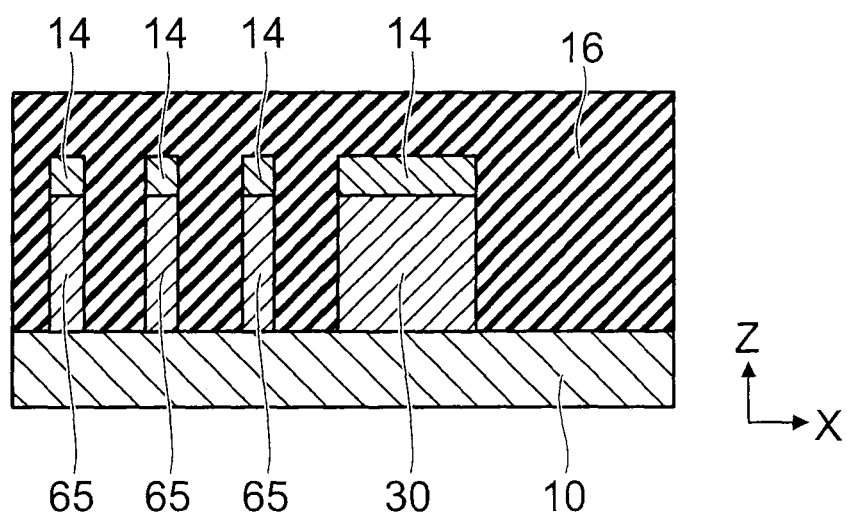

Next, as shown in FIG. 7A, an insulating film 16 is formed on the wafer. As shown in FIG. 7B, the insulating film 16 fills between the adjacent element parts 65, between the element part 65 and the adjustment part 30, and a side of the adjustment part 30 opposite to the side where the element part 65 is provided. The insulating film 16 is a silicon oxide film or a silicon nitride film formed by means of the CVD method, for example.

Subsequently, the insulating film 16 is etched back to remove parts covering the element part 65 and the adjustment part 30. The mask 14 is not etched at this time in order to protect an element part 64, the adjustment part 30, and the insulating film 12 located below the mask 14. Then, an insulating film 12 remains between the element parts 65 and between the adjustment parts 30 adjacent in the Y direction.

In this etching, for example, the RIE method is used to remove the insulating film 16 formed on the mask 14, a part of the insulating film 16 filled between the adjacent element parts 65, and a part of the insulating film 16 formed on the side of the adjustment part 30 opposite to the side where the element part 65 is formed.

Figure 8A:
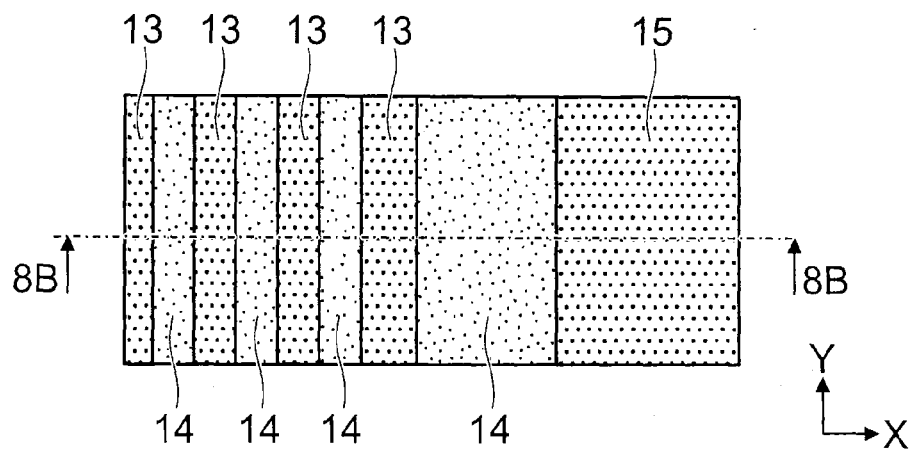
Figure 8B:
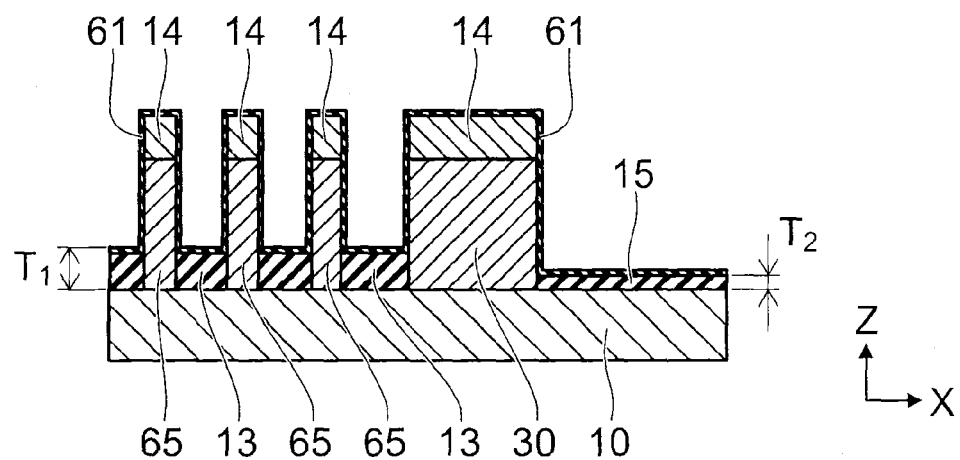

As a result, as shown in FIG. 8A and FIG. 8B, the insulating film 13 is formed between the adjacent element parts 65 and between the element part 65 and the adjustment part 30 in the X direction. The insulating film 15 is also formed on the global bit line 10 extending in the X direction from the side surface 30b of the adjustment part 30 opposite to the side where the element part 65 is formed. A thickness $T_2$ of the insulating film 15 in the Z direction is thinner than a thickness $T_1$ of the insulating film 13.

Due to so called a micro-loading effect of the RIE method, an etching rate of the insulating film 16 in a part where an opening width is wide is faster than a part where the opening width is narrow. In other words, on the same wafer, the etching rate of the insulating film 16 provided on the global bit line 10 extending from the side surface 30b of the adjustment part 30 is faster than the etching rate of the insulating film 16 between the adjacent element parts 65 and between the element part 65 and the adjustment part 30. The insulating film 15 is thus formed thinner than the insulating film 13.

On the other hand, the interval between the masks 14 adjacent in the X direction is the same between the parts formed on each of the element parts 65 and between the part formed on the element part 65 and the part formed on the adjustment part 30. The thickness of the insulating film 13 formed between the adjacent element parts 65 is therefore about the same as the thickness of the insulating film 13 formed between the element part 65 and the adjustment part 30.

As shown in FIG. 8B, the insulating film 61 is formed on the surface of the element part 65 and the adjustment part 30. The insulating film 61 is a silicon oxide film continuously formed using the CVD method, for example, on the surface of the insulating film 13, the element part 65, the mask 14, the adjustment part 30, and the insulating film 15. The insulating film 61 may also be a silicon oxide film formed by thermally oxidizing polycrystalline silicon or formed using ALD (Atomic layer deposition). Note that the insulating film 61 is omitted from the plan view below in order to show each component.

Figure 9A:
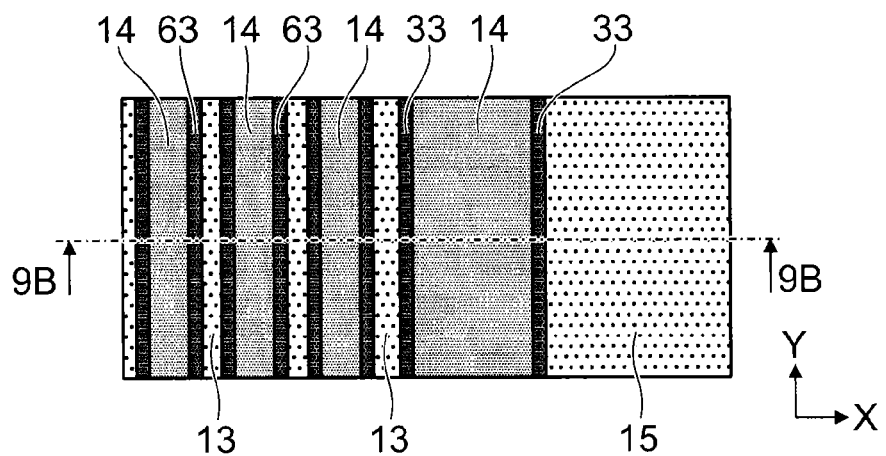
Figure 9B:
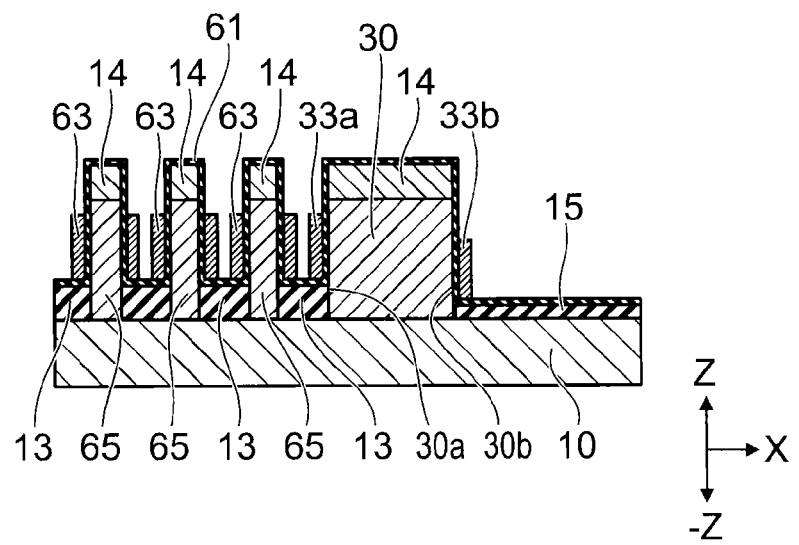

Now, as shown in FIG. 9A and FIG. 9B, the control electrode 63 is formed on the side surface of the element part 65 via the insulating film 61. For example, a conductive film such as a metal film or a polycrystalline silicon film is formed on the entire surface of the wafer on which the insulating film 13 and the insulating film 15 are formed, the polycrystalline silicon film containing an impurity or the like and being given conductivity. Then, the conductive film formed on the upper surface of each of the element part 65, the adjustment part 30, and the insulating films 13 and 15 is etched using anisotropic etching method.

The conductor film is etched by using a condition that an etching rate in the −Z direction is faster than the etching rate in the X direction and the Y direction in the RIE method, for example, thereby leaving the control electrode 63 on the side surface of the element part 65. At this time, outer electrodes 33a and 33b are formed on both sides of the adjustment part 30, respectively. That is, the outer electrodes 33a and 33b include the same material as that of the control electrode 63.

The insulating film 15 is formed thinner than the insulating film 13 in the Z direction, whereby an insulation breakdown voltage between the global bit line 10 and the outer electrode 33b (a second outer electrode) formed on the side of the side surface 30b of the adjustment part 30 is smaller than an insulation breakdown voltage between the global bit line 10 and the control electrode 63. This possibly causes breakdown between the global bit line 10 and the outer electrode 33b. On the other hand, the thickness of the insulating film 13 formed between the element part 65 and the adjustment part 30 is the same as the thickness of the insulating film 13 formed between the adjacent element parts 65. An insulation breakdown voltage between the outer electrode 33a formed on the side of the side surface 30a of the adjustment part 30 and the global bit line 10 is thus kept higher than the insulation breakdown voltage between the outer electrode 33b and the global bit line 10. Accordingly, the outer electrode 33b is removed through the process shown in each of FIG. 10A to FIG. 11B in the embodiment.

Figure 10A:
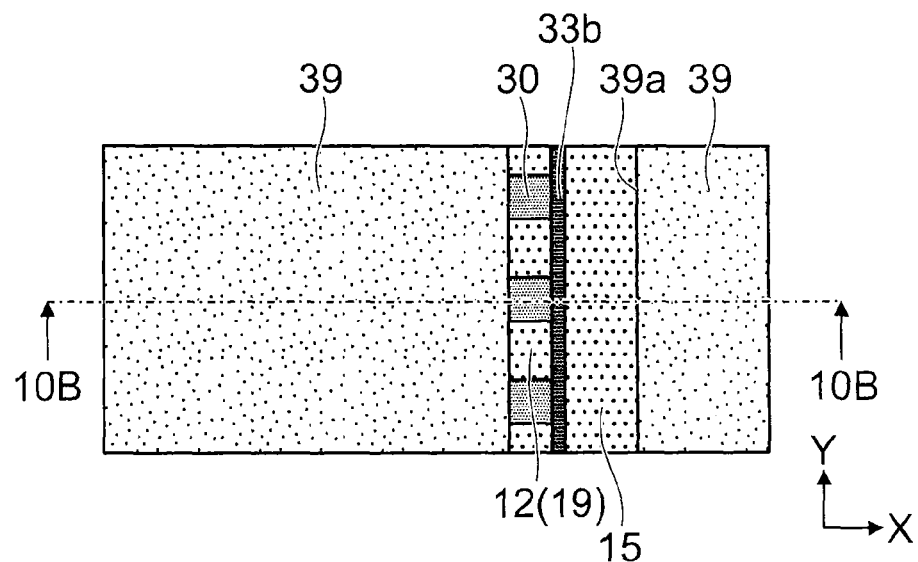
Figure 10B:
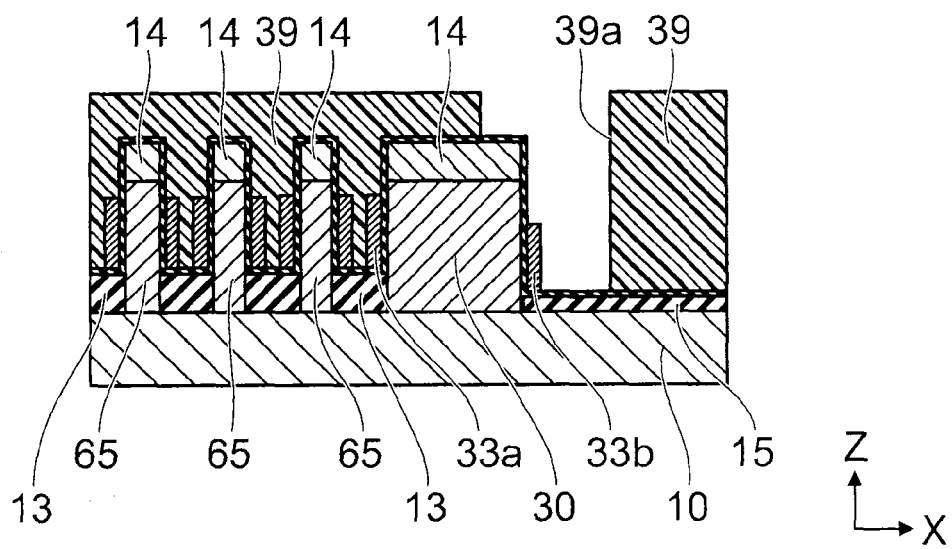

For example, a mask 39 having an opening 39a is formed on the wafer as shown in FIG. 10A and FIG. 10B. The outer electrode 33b and a part of the adjustment part 30 on which the outer electrode 33b is formed are exposed at a bottom surface of the opening 39a.

The outer electrode 33b is removed subsequently. For example, the outer electrode 33b can be etched selectively by using a condition having selectivity against the adjustment part 30 and the insulating films 12 and 15 exposed at the bottom surface of the opening 39a and etching the conductive film included in the outer electrode 33b. This etching may be performed by the RIE method, for example.

Figure 11A:
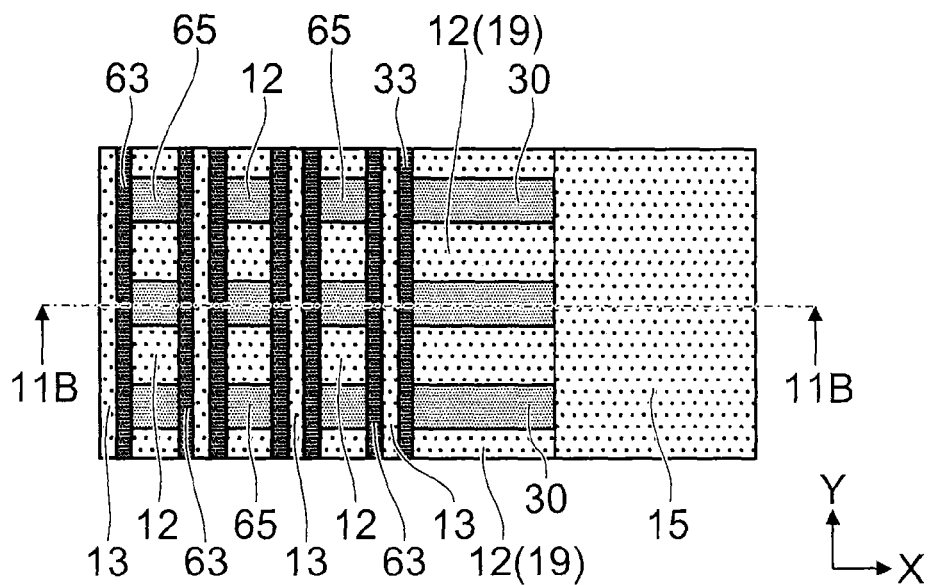
Figure 11B:
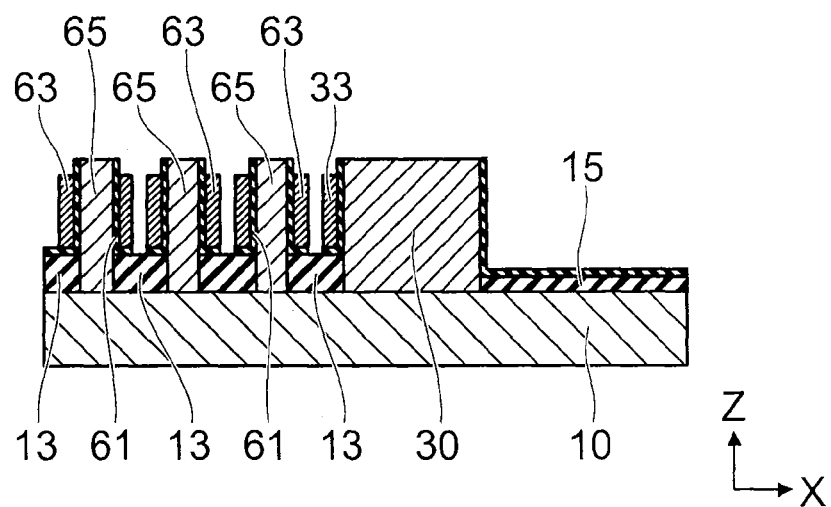

Thereafter, the insulating film 61 formed around the mask 14 is removed, followed by removing of the mask 14. As a result, as shown in FIG. 11A and FIG. 11B, there can be obtained a structure having the control electrode 63 facing the side surface of the element part 65 via the insulating film 61 and the outer electrode 33 formed between the element part 65 and the adjustment part 30.

An interlayer insulating film is then formed on the entire surface of the wafer, and a conductive material to be a word line WL and an interlayer insulating film are stacked alternately on the interlayer insulating film (hereinafter refer to FIG. 1). Then, a hole passing through the stacked body and communicating with the upper surface of the element part 65 is formed. After that, the memory layer 50 and the local bit line 20 are formed sequentially on the side surface of the hole. Moreover, the stacked body is processed to form the word line 40 facing the local bit line 20 through the memory layer 50, thereby completing the memory cell array 1. Note that, instead of removing the mask 14 in the process in FIG. 11A and FIG. 11B, it may be possible to remain the mask 14, and selectively remove the mask 14 at the bottom of the hole communicating with the upper surface of the element part 65.

A method of manufacturing the non-volatile memory device according to a variation of the first embodiment will now be described with reference to FIGS. 12A to 12D. FIG. 12A to FIG. 12D are schematic cross-sectional views showing an example of the manufacturing process of the non-volatile memory device according to the variation of the first embodiment.

As shown in FIG. 12A, a plurality of element parts 65 and an adjustment part 30 are formed on a global bit line 10. The interval between the element part 65 and the adjustment part 30 in the X direction is the same as the interval between the element parts 65 adjacent to each other.

The element part 65 and the adjustment part 30 contain polycrystalline silicon, for example. In other words, the element part 65 and the adjustment part 30 are formed simultaneously by dividing a polycrystalline silicon layer formed on the global bit line 10, for example. A mask 14 is also formed on the element part 65 and the adjustment part 30.

Next, as shown in FIG. 12B, an insulating film 18 is formed on the entire surface of the wafer by the CVD method or a PVD (Physical Vapor Deposition) method, for example. The film thickness of the insulating film 18 may be uneven in this case as well due to the micro-loading effect of a CVD device or a PVD device. For example, an insulating film 18a formed between the adjacent element parts 65 and between the element part 65 and the adjustment part 30 is thicker than an insulating film 18b formed on the global bit line 10 extending in the X direction from a side surface 30b of the adjustment part 30.

As shown in FIG. 12C, the insulating film 18 formed on the upper surface of the element part 65 and the adjustment part 30 is removed. The insulating film 18 may be removed by using the RIE method, for example. An insulating film 61 is then formed covering the element part 65 and the adjustment part 30.

After that a control electrode 63 is formed on the side surface of the element part 65 by the manufacturing process shown in FIG. 9A to FIG. 11B. As shown in FIG. 12D, an outer electrode 33b formed on the side of the side surface 30b of the adjustment part 30 is removed in this case as well while leaving an outer electrode 33a between the element part 65 and the adjustment part 30.

In the embodiment, the adjustment part 30 is provided on both sides of the element parts 65 provided side by side on the global bit line 10, as described above. The interval between the adjustment part 30 and an element part 65a adjacent thereto is made equal to the interval between the adjacent element parts 65. As a result, the thickness of the insulating film can be formed about uniformly between the element part 65 and the adjustment part 30 and between the adjacent element parts 65. Furthermore, the outer electrode 33b formed at the same time as the control electrode 63 and the outer electrode 33a is removed, thereby avoiding breakdown between the global bit line 10 and the outer electrode 33a.

In the embodiment, the influence of ununiformity caused by the micro-loading effect can be avoided as described above, thereby suppressing the breakdown at the outer electrode. As a result, the manufacturing yield may be improved as well as reliability of the non-volatile memory device.

There is also a case where the interval between the element part 65a and the adjustment part 30 differs from the interval between the adjacent element parts 65. For example, the insulating film 13 formed between the element part 65a and the adjustment part 30 may be thick enough not to cause the breakdown between the global bit line 10 and the control electrode 63. In other words, the interval between the element part 65a and the adjustment part 30 may be set such that the insulating film 13 provided therebetween is thicker than the insulating film 15 and that the insulation breakdown voltage is high enough between the global bit line 10 and the control electrode 63 provided on the insulating film 13.

Second Embodiment

FIG. 13A to FIG. 17C are schematic views illustrating a process of manufacturing a non-volatile memory device according to a second embodiment. A figure denoted by an alphabet A in each drawing corresponds to a plan view showing an upper surface of a wafer, while a figure denoted by an alphabet B in each drawing corresponds to a cross-sectional view along a line shown in the plan view.

Figure 13A:
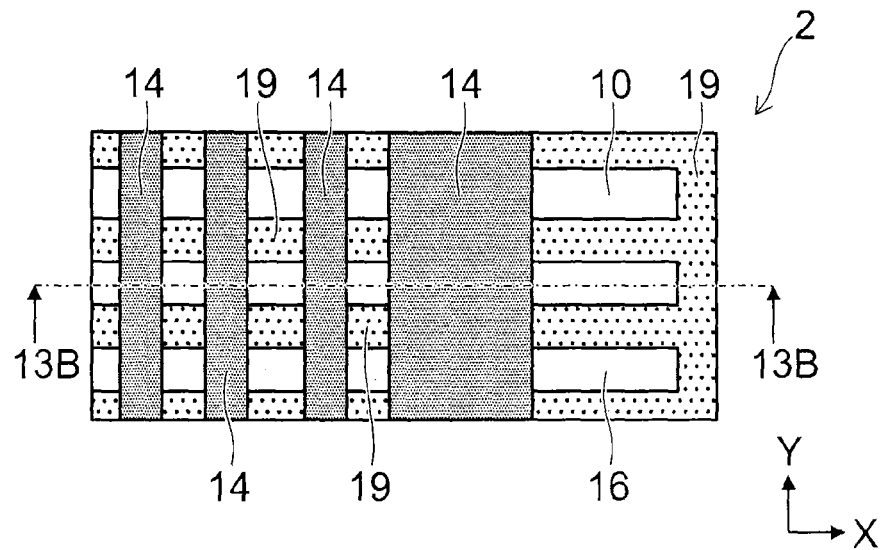
FIGS. 13A to 17C are schematic views illustrating an example of a manufacturing process of a non-volatile memory device according to a second embodiment.

As shown in FIG. 13A, a plurality of global bit lines 10 is provided side by side in the Y direction. Each of the global bit lines 10 extends in the X direction. An insulating film 19 (a fourth insulating film) is provided around the global bit line 10 in an X-Y plane.

Figure 13B:
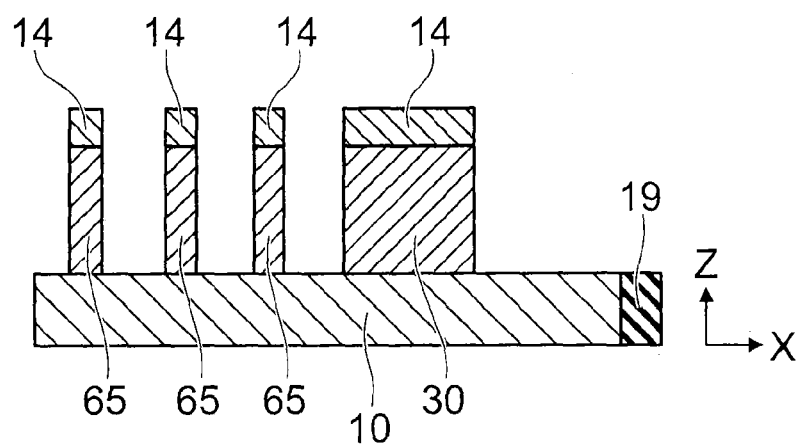

As shown in FIG. 13B, a plurality of element parts 65 and an adjustment part 30 are formed on each global bit line 10. The element part 65 and the adjustment part 30 are formed simultaneously by dividing a polycrystalline silicon layer formed on the global bit line 10, for example. In the X direction, the distance between the adjustment part 30 and the element part 65 adjacent thereto is about the same as the distance between the element parts 65 adjacent to each other.

Figure 14A:
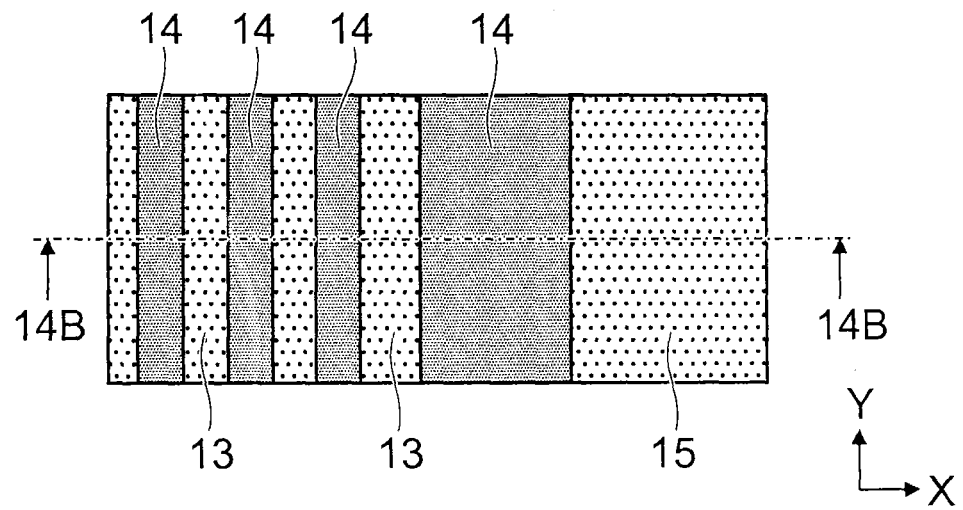
Figure 14B:
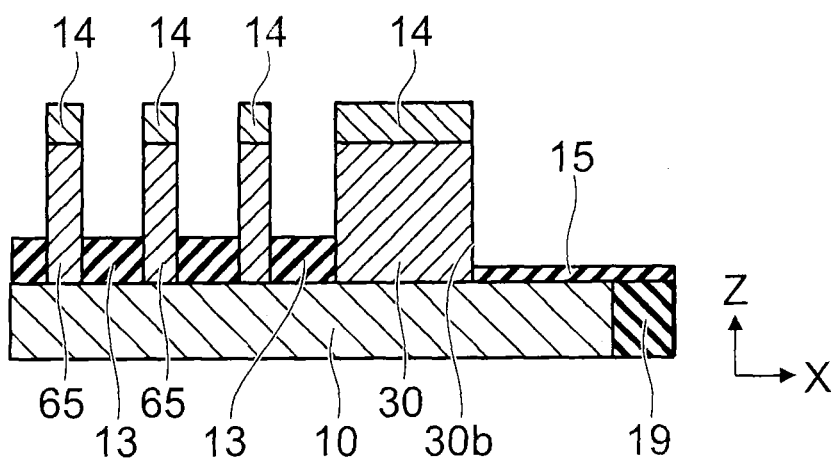

As shown in FIG. 14A and FIG. 14B, an insulating film 13 is formed between the adjacent element parts 65 and between the element part 65 and the adjustment part 30. Simultaneously, an insulating film 15 is formed on the global bit line 10 extending in the X direction from a side surface 30b of the adjustment part 30 opposite to the surface facing the element part 65. The insulating film 13 and the insulating film 15 are formed by the same method as that in the manufacturing process shown in FIG. 7A to FIG. 8B. The insulating film 15 is formed thinner than the insulating film 13 due to the micro-loading effect.

Figure 15A:
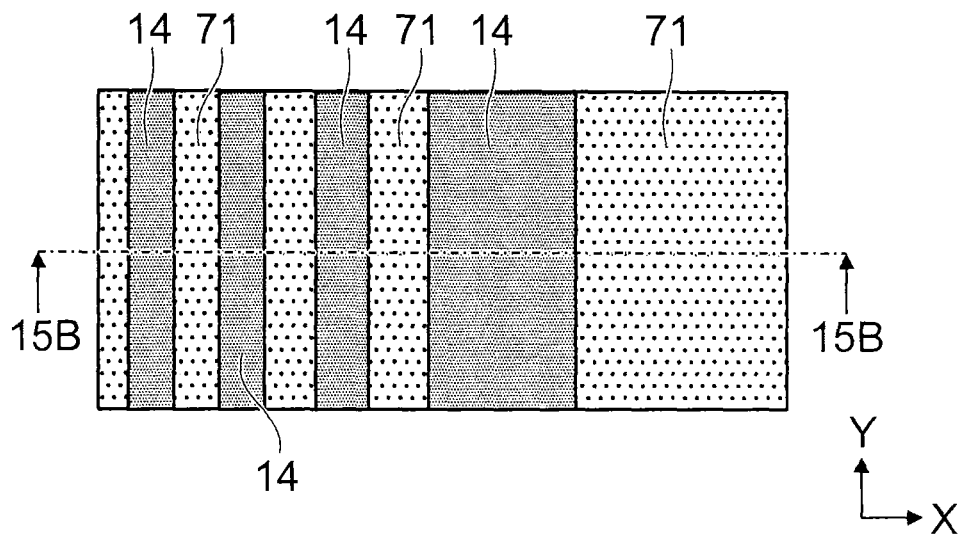
Figure 15B:
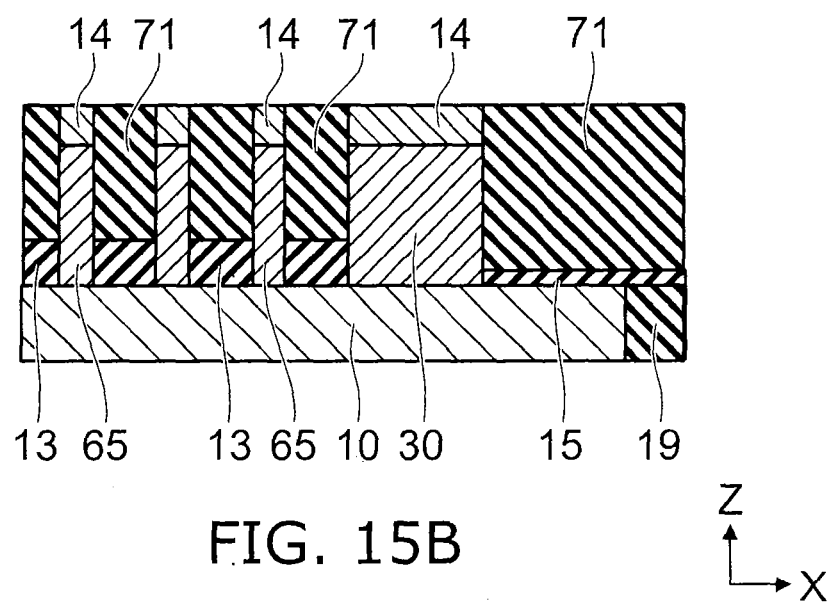

Next, as shown in FIG. 15A and FIG. 15B, an insulating film 71 is formed to fill between the adjacent element parts 65, between the element part 65 and the adjustment part 30, and the side of the adjustment part 30 opposite to the side where the element part 65 is formed. The insulating film 71 is a silicon oxide film or a silicon nitride film formed on the wafer by a CVD (Chemical Vapor Deposition) method, for example. Then, the insulating film 71 is etched back to remove a part formed above a mask 14.

Figure 16A:
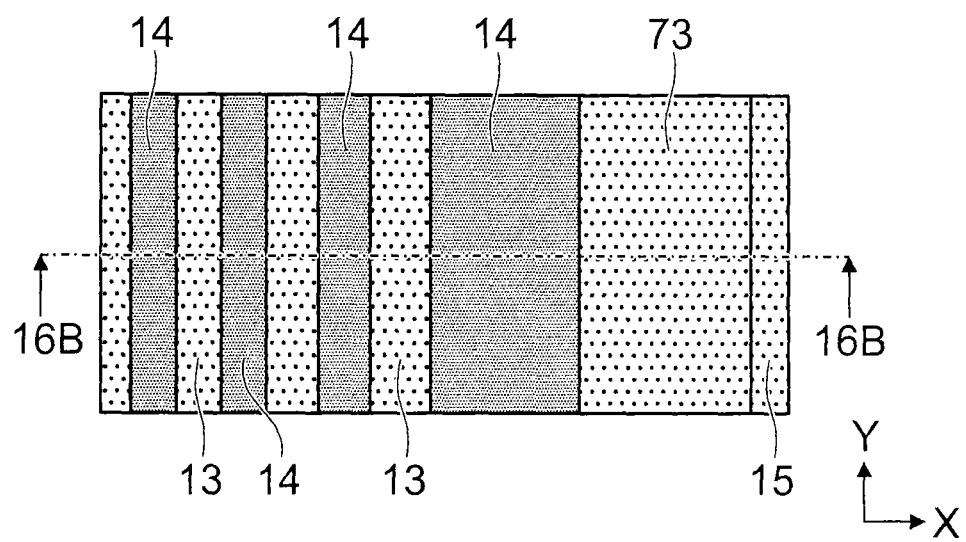
Figure 16B:
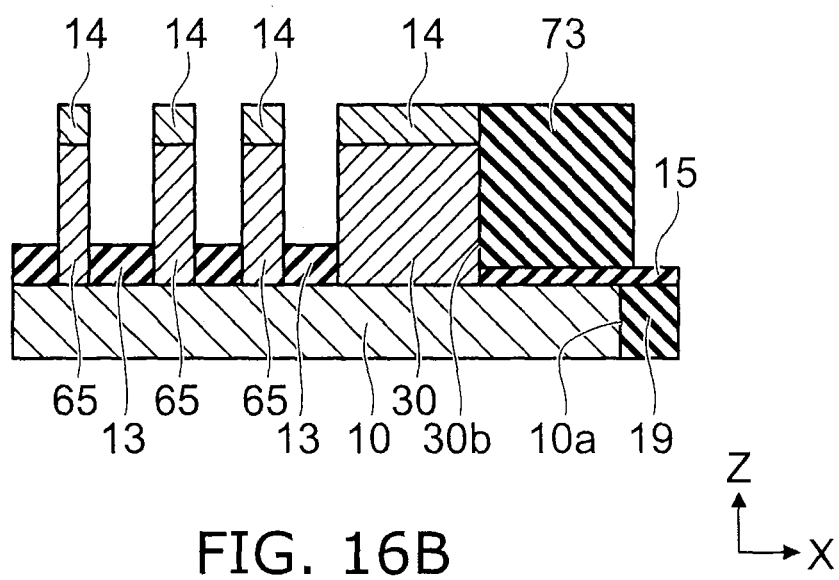

Thereafter, the insulating film 71 is selectively etched to form an insulating body 73 in contact with the side surface 30b of the adjustment part 30 as shown in FIG. 16A and FIG. 16B, and the insulating film 71 is also etched between the adjacent element parts 65 and between the element part 65 and the adjustment part 30. A side surface 73b of the insulating body 73 on the side opposite to the side, where the adjustment part 30 is formed, locates at a position beyond an end 10a of the global bit line 10 in the X direction. Note that the insulating film 71 may remain partially between the adjacent element parts 65 and between the element part 65 and the adjustment part 30.

Figure 17A:
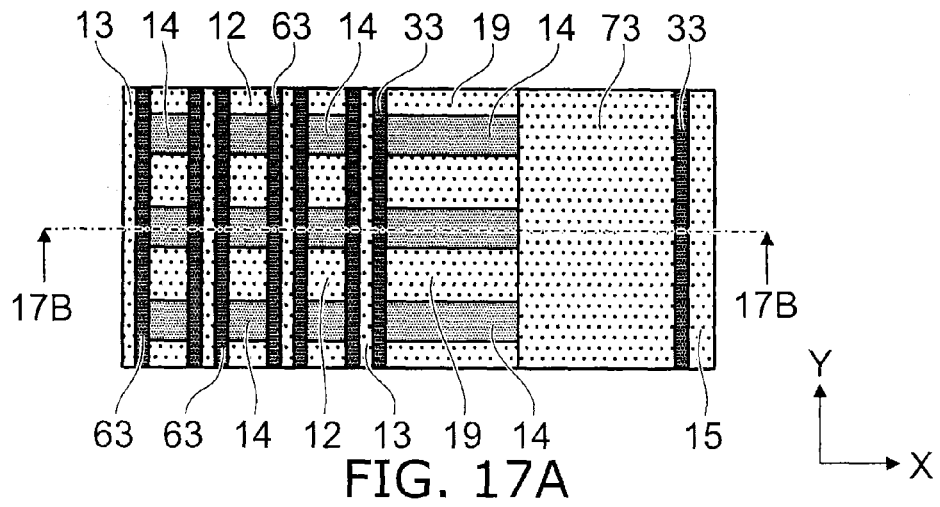
Figure 17B:
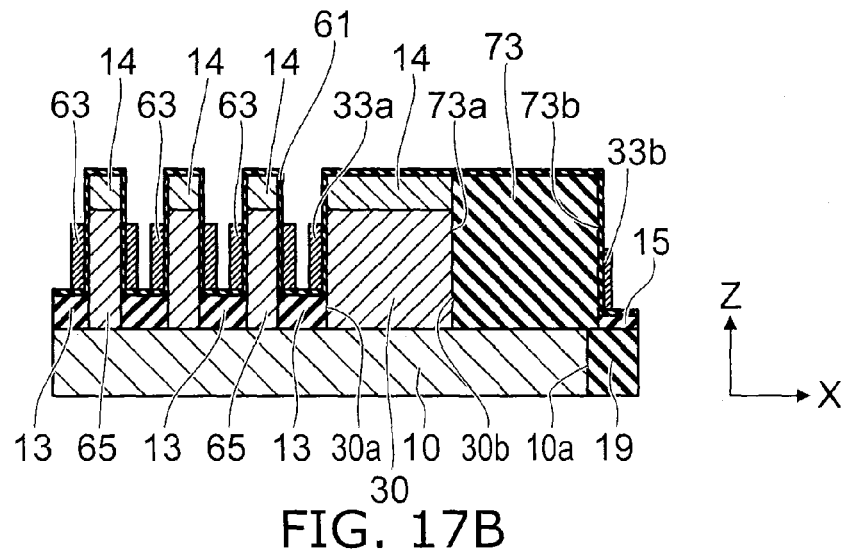

As shown in FIG. 17A and FIG. 17B, an insulating film 61 is formed to cover the element part 65, the adjustment part 30, and the insulating body 73. The insulating film 61 is a silicon oxide film formed continuously on the surface of the insulating film 13, the element part 65, the mask 14, the adjustment part 30, the insulating film 15 and the insulating body 73 by the CVD method, for example. The insulating film 61 may also be a silicon oxide film formed by thermally oxidizing polycrystalline silicon, for example.

A control electrode 63 is now formed on both sides of the element part 65 via the insulating film 61. Simultaneously, an outer electrode 33a is formed contiguously to a side surface 30a of the adjustment part 30, while an outer electrode 33b is formed contiguously to the side surface 73b of the insulating body 73.

As shown in FIG. 17B, the side surface 73b of the insulating body 73 is located outside the end 10a of the global bit line 10 in the X direction. That is, the outer electrode 33b is formed on the insulating film 19 via the insulating film 15. It is said that the outer electrode 33b is not located directly above the global bit line 10. The insulation breakdown voltage may be improved between the global bit line 10 and the outer electrode 33b as a result. The outer electrode 33b can therefore be left in the embodiment.

Figure 17C:
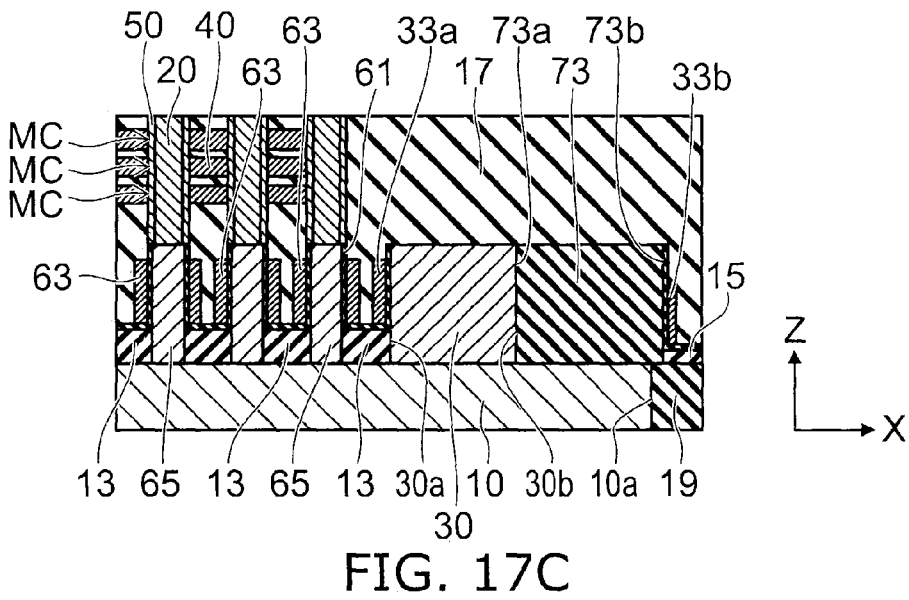

Then, the non-volatile memory device shown in FIG. 17C is completed through the processes for manufacturing a memory cell array as describe above.

FIG. 18A to FIG. 19C are schematic views showing a process of manufacturing a non-volatile memory device according to a variation of the second embodiment. Each figure denoted by an alphabet A corresponds to a plan view showing an upper surface of a wafer, while each drawing denoted by an alphabet B corresponds to a cross-sectional view along a line shown in the plan view.

Figure 18A:
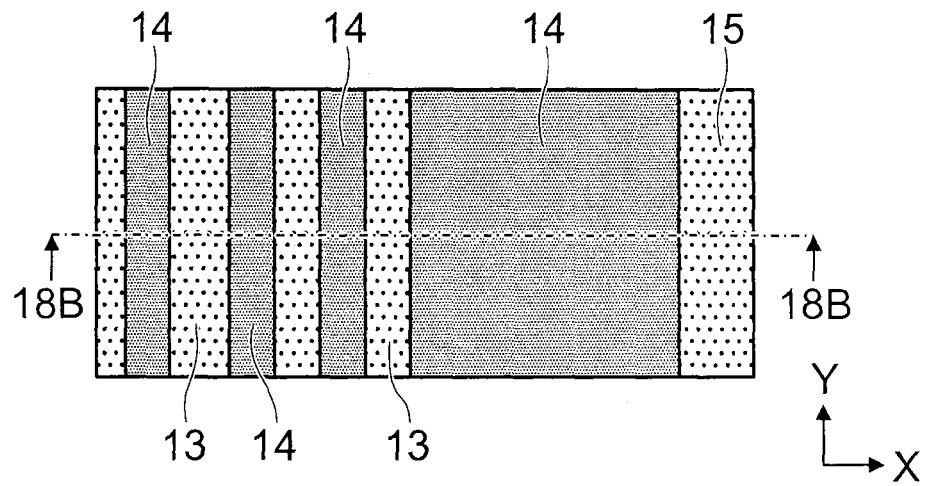
FIGS. 18A to 19C are schematic views illustrating an example of a manufacturing process of a non-volatile memory device according to a variation of the second embodiment.
Figure 18B:
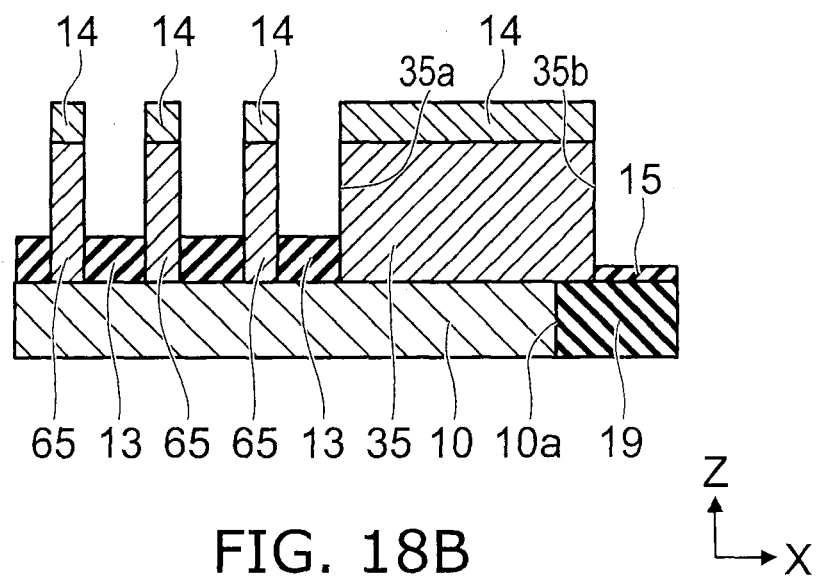

As shown in FIG. 18A and FIG. 18B, an insulating film 13 is formed between element parts 65 adjacent to each other and between the element part 65 and an adjustment part 35. An insulating film 15 is also formed on a side of the adjustment part 35 opposite to the side facing the element part 65.

The interval between the adjustment part 35 and the element part 65 adjacent thereto is equal to the interval between the adjacent element parts 65 in this example as well. The adjustment part 35 is formed to extend beyond an end 10a of a global bit line 10 in the X direction from a side surface 35a facing the element part 65. Accordingly, a side surface 35b of the adjustment part 35 is located above an insulating film 19. The insulating film 15 is formed on the insulating film 19. The insulating film 15 is formed thinner than the insulating film 13 due to the micro-loading effect.

Figure 19A:
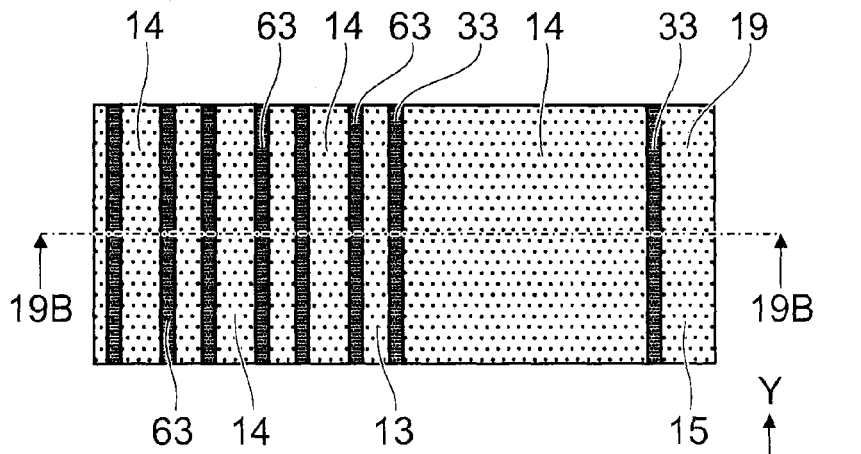
Figure 19B:
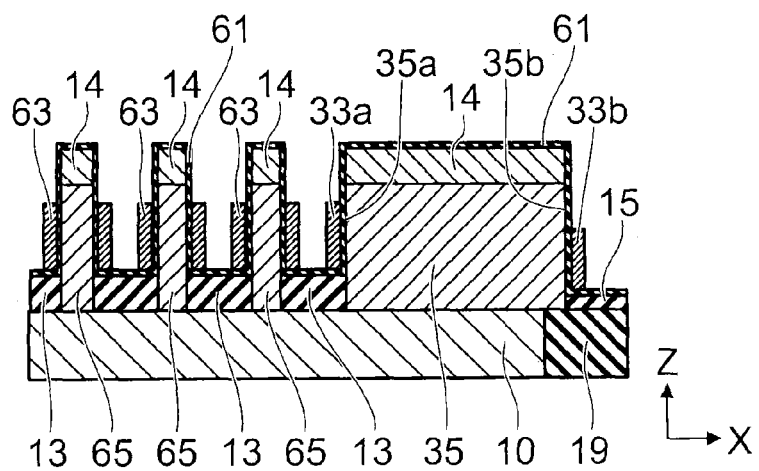

Next, as shown in FIG. 19A and FIG. 19B, an insulating film 61 is formed to cover the element part 65 and the adjustment part 35. A control electrode 63 is then formed on a side surface of the element part 65 via the insulating film 61. An outer electrode 33a adjacent to the side surface 35a and an outer electrode 33b adjacent to the side surface 35b are formed at the same time as the control electrode 63.

The side surface 35b of the adjustment part 35 is located outside the end 10a of the global bit line 10 in the X direction. The outer electrode 33b is formed on the insulating film 19 via the insulating film 15. It is said that the outer electrode 33b is not located directly above the global bit line 10. Accordingly, the insulation breakdown voltage between the global bit line 10 and the outer electrode 33b may be improved, whereby the outer electrode 33b can be left.

Figure 19C:
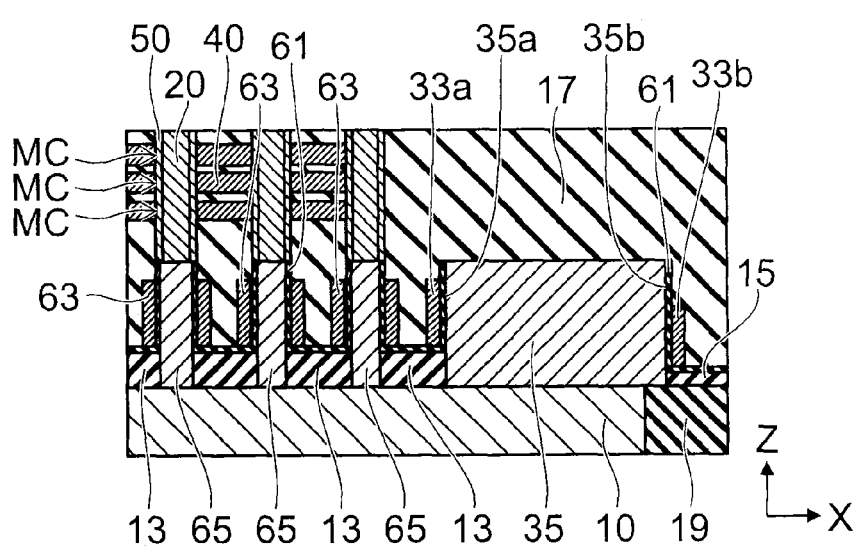

Then, the non-volatile memory device shown in FIG. 19C is completed through the processes for manufacturing a memory cell array as describe above.

Third Embodiment

Figure 20A:
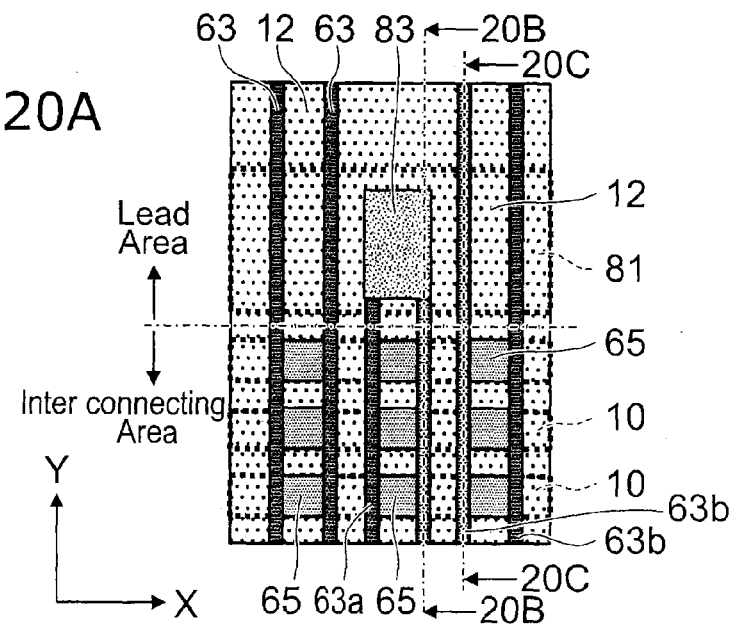
FIGS. 20A to 20C are schematic views illustrating an example of a non-volatile memory device according to a third embodiment.
Figure 20B:
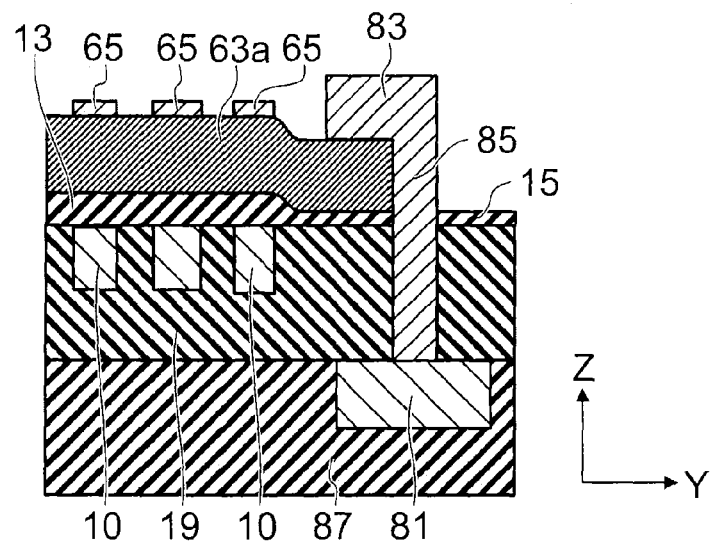
Figure 20C:
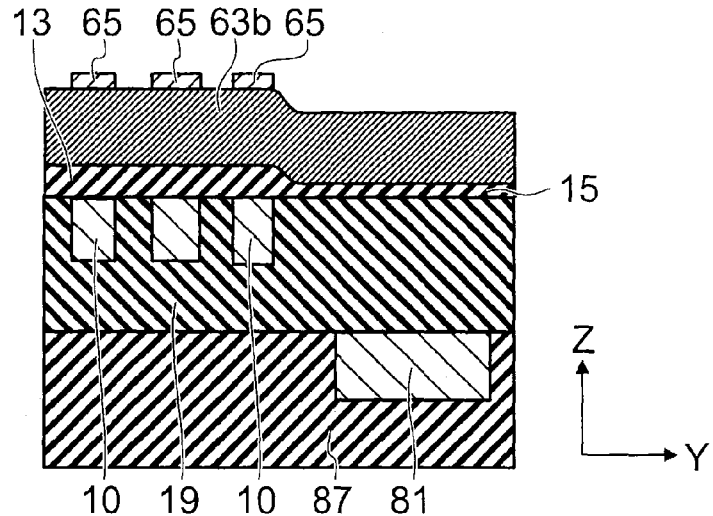

FIG. 20A to FIG. 20C are schematic views showing an example of a non-volatile memory device according to a third embodiment. FIG. 20A is a plan view showing an upper surface of a wafer, whereas FIG. 20B is an example of a schematic view showing a cross section taken along line 20B-20B shown in FIG. 20A. FIG. 20C is an example of a schematic view showing a cross section taken along line 20C-20C shown in FIG. 20A.

Figure 21:
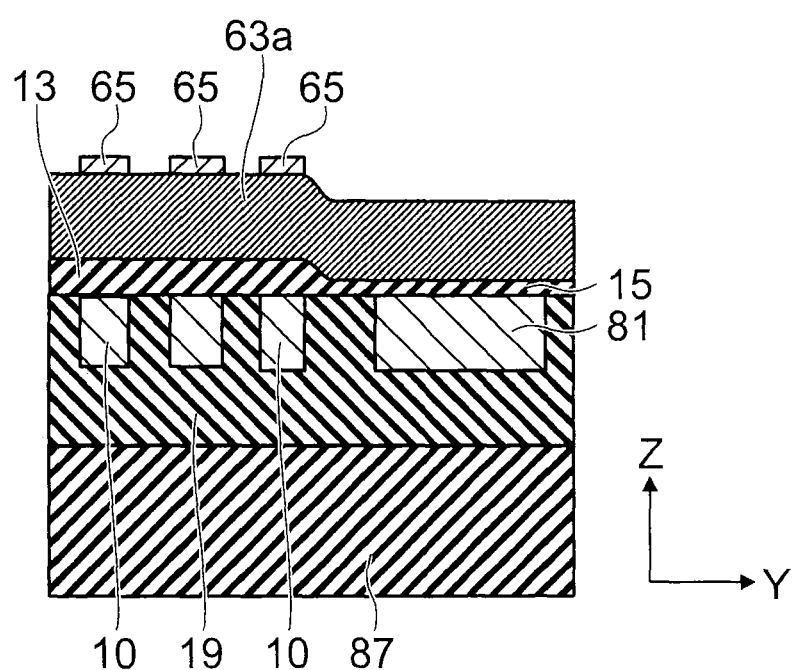
FIG. 21 is an example of a schematic view illustrating a non-volatile memory device according to a comparative example of the third embodiment.

FIG. 21 is an example of a schematic view showing a non-volatile memory device according to a comparative example of the third embodiment, and is a schematic view corresponding to a cross section taken along line 20C-20C shown in FIG. 20A.

As shown in FIG. 20A to FIG. 20C, a control interconnection 81 is provided side by side with a global bit line 10 at one end thereof, the global bit line 10 being aligned in the Y direction. A control electrode 63 extending in the Y direction is electrically connected to the control wiring 81.

An insulating film 13 is provided between two of element parts 65 adjacent to each other in the X direction. Moreover, an insulating film 15 is formed outside the element part 65 located at an end of the element parts 65 aligned in the Y direction (e.g. in a lead area). The insulating film 15 is provided thinner than the insulating film 13 due to the micro-loading effect. The lead area here corresponds to an area where the control electrode 63 is lead out to a lower level interconnection through a contact plug. The lead area is also a part where the interval among the element parts 65 aligned in the Y direction becomes wider and an area where the insulating film 15 is formed to be thinner than the insulating film 13. In other words, it is satisfactory that, even when the element part is disposed in the lead area, the interval between the element parts 65 is wide and that the insulating film 15 is formed thinner than the insulating film 13. An area where the global bit line 10 is disposed is referred to as an interconnection area.

As shown in FIG. 20B and FIG. 20C, the control interconnection 81 is an interlayer wiring provided in a lower level than the global bit line 10, for example. A contact plug 85 is provided to electrically connect the control interconnection 81 and an end of a control electrode 63a extending in the X direction in the lead area. The contact plug 85 passes through the insulating film 15 and the insulating film 19 in the −Z direction to electrically connect the control electrode 63a and the control wiring 81.

Moreover, the contact plug 85 is in contact with an upper surface and a side surface of the control electrode 63a at the end thereof. Contact resistance between the contact plug 85 and the control electrode 63a can be decreased as a result.

For example, as shown in FIG. 21, there is only the insulating film 15 that is interposed between the control electrode 63 and the control wiring 81 in a structure where the control interconnection 81 and the global bit line 10 are provided in the same level. This means that the insulation breakdown voltage between the control wiring 81 and a control electrode 63b not electrically connected to the control wiring 81 depends solely on the insulating film 15. Accordingly, there is a possibility of breakdown caused between the control wiring 81 and the control electrode 63b when the insulating film 15 is formed thinner than the insulating film 13 due to the micro-loading effect. That is, the insulating film 13 is disposed in the wiring area, while the insulating film 15 thinner than the insulating film 13 is disposed in the lead area.

Now, in this embodiment, the control wiring 81 is disposed in the lower level interconnections below the global bit line 10 so that the insulation breakdown voltage is improved between the control electrode 63 and the control wiring 81. In other words, no interconnection is provided in the same layer as the global bit line 10 below the control electrode 63 in the lead area. The manufacturing yield and reliability of the non-volatile memory device may be improved as a result.

Note that in this embodiment, the adjustment part 30 is provided on both sides of the element part 65 aligned in the X direction as with the first and second embodiments. As a result, reducing the insulation breakdown voltage due to the micro-loading effect can be suppressed between the global bit line 10 and the control electrode 63.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
    a first interconnection extending in a first direction;
    a plurality of second interconnections provided on the first interconnection and extending in a second direction intersecting the first direction;
    a memory layer provided on a side surface of each second interconnection;
    a control element provided between each of the second interconnections and the first interconnection, and including an element part extending in the second direction on the first interconnection and a control electrode facing a side surface of the element part via a first insulating film;
    an adjustment part provided on the first interconnection and adjacent to a control element connected to a second interconnection disposed at an end position of the second interconnections arranged in the first direction; and
    a first outer electrode provided between the adjustment part and the control element disposed at the end position.

2. The device according to claim 1, further comprising:
    a second insulating film provided between the first interconnection and the control electrode; and
    a third insulating film provided on part of the first interconnection extending in the first direction on a side of the adjustment part opposite to a side facing the control element connected to the second interconnection disposed at the end position, the third insulating film being thinner than the second insulating film.

3. The device according to claim 1, wherein
    a distance between the adjustment part and an element part included in the control element connected to the second interconnection disposed at the end position is a same as a distance between each of the element parts.

4. The device according to claim 1, further comprising a second outer electrode provided on a side surface of the adjustment part on a side opposite to a side facing the first outer electrode,
    wherein the adjustment part extends beyond an end of the first interconnection in the first direction.

5. The device according to claim 4, further comprising a fourth insulating film provided around an end of the first interconnection in the first direction,
    wherein the second outer electrode is provided on the fourth insulating film.

6. The device according to claim 1, further comprising:
    an insulating body provided on a side surface of the adjustment part on a side opposite to a side facing the first outer electrode and extending beyond an end of the first interconnection in the first direction; and
    a second outer electrode provided on a side of the insulating body opposite to the side facing the adjustment part.

7. The device according to claim 6, further comprising a fourth insulating film provided around an end of the first interconnection in the first direction,
    wherein the second outer electrode is provided on the fourth insulating film.

8. The device according to claim 1, wherein a second outer electrode formed simultaneously with the first outer electrode is removed, the second outer electrode being formed on a side surface of the adjustment part on a side opposite to a side facing the first outer electrode.

9. The device according to claim 1, further comprising a third interconnection provided between two of the second interconnections adjacent to each other and extending in a third direction orthogonal to a plane including the first direction and the second direction,
    wherein the memory layer is provided between each second interconnection and the third interconnection.

10. The device according to claim 1, wherein the first outer electrode contains a same metal as that contained in the control electrode.

11. The device according to claim 1, wherein the adjustment part includes a same material as that contained in the element part.

12. A non-volatile memory device comprising:
    a first interconnection extending in a first direction;
    a plurality of second interconnections provided on the first interconnection, each of the second interconnections extending in a second direction intersecting the first direction;
    a memory layer provided on a side surface of each second interconnection;
    a plurality of control elements provided respectively between each second intersection and the first intersection, and including a plurality of element parts and a plurality of control electrodes, each of the control elements including any one of the element parts extending in the second direction, and each of the control electrodes provided between two of the element parts adjacent to each other, and facing each side surface of the two of the element parts via a first insulating film;
    an adjustment part provided on the first interconnection and adjacent to a element part disposed at an end position of the element parts arranged in the first direction, another control electrode being provided between the adjustment part and the element part disposed at the end position;
    a second insulating film provided between each of the control electrodes and the first interconnection, and between the another control electrode and the first interconnection; and
    a third insulating film provided on part of the first interconnection extending in the first direction from the adjustment part on a side opposite to a side facing the another control electrode, and being thinner than the second insulating film.

13. The device according to claim 12, wherein an electrode is not disposed on the third insulating film, the electrode having a same material as that of the control electrode.

* * * * *